United States Patent
Bajic et al.

(10) Patent No.: US 10,644,721 B2
(45) Date of Patent: May 5, 2020

(54) PROCESSING CORE DATA COMPRESSION AND STORAGE SYSTEM

(71) Applicant: Tenstorrent Inc., Toronto (CA)

(72) Inventors: Ljubisa Bajic, Toronto (CA); Alex Cejkov, Toronto (CA); Lejla Bajic, Toronto (CA)

(73) Assignee: Tenstorrent Inc., Toronto (CA)

( * ) Notice: Subject to any disclaimer, the term of this patent is extended or adjusted under 35 U.S.C. 154(b) by 0 days.

(21) Appl. No.: 16/434,065

(22) Filed: Jun. 6, 2019

(65) Prior Publication Data

US 2019/0379396 A1    Dec. 12, 2019

Related U.S. Application Data

(60) Provisional application No. 62/683,205, filed on Jun. 11, 2018.

(51) Int. Cl.
| | | |
|---|---|---|
| *H03M 7/46* | (2006.01) | |
| *G06F 17/16* | (2006.01) | |
| *H03M 7/42* | (2006.01) | |

(52) U.S. Cl.
CPC .............. *H03M 7/46* (2013.01); *G06F 17/16* (2013.01); *H03M 7/42* (2013.01)

(58) Field of Classification Search
CPC ............ H03M 7/46; H03M 7/42; G06F 17/16
USPC .......................................................... 341/59
See application file for complete search history.

(56) References Cited

U.S. PATENT DOCUMENTS

| | | | |
|---|---|---|---|
| 5,206,822 A | 4/1993 | Taylor | |
| 5,363,098 A | 11/1994 | Antoshenkov | |
| 5,493,407 A | 2/1996 | Takahara | |
| 6,535,150 B1 | 3/2003 | Ross | |
| 8,612,723 B2 * | 12/2013 | Burkart | G06F 12/0207 |
| | | | 711/217 |

(Continued)

FOREIGN PATENT DOCUMENTS

| | | |
|---|---|---|
| CA | 2871435 C | 2/2017 |
| CN | 103336758 A | 10/2013 |

OTHER PUBLICATIONS

Buluç, A., et al., "Parallel Sparse Matrix-Vector and Matrix-Transpose-Vector Multiplication Using Compressed Sparse Blocks", ACM Symp. on Parallelism in Algorithms and Architectures, Aug. 11-13, 2009, Calgary, Alberta, Canada, 12 pages.

(Continued)

*Primary Examiner* — Khai M Nguyen
(74) *Attorney, Agent, or Firm* — Daylight Law, P.C.

(57) ABSTRACT

Methods and systems regarding the rapid and efficient compression and decompression of sparse data are disclosed. One method for compressing a set of data from a sparse matrix includes, evaluating a sequence of data entries from the set of data, extracting a sequence of sparse data values from the sequence, extracting a sequence of non-sparse data value run lengths from the sequence, formulating a set of row pointers from the sequence, storing the sequence of sparse data values in a first set of memory addresses, and storing the sequence of non-sparse data value run lengths in a second set of memory addresses. The set of row pointers identify a set of rows of the sparse matrix in both the first and second sets of memory addresses. Rapid decompression can be conducted using the row pointers.

20 Claims, 7 Drawing Sheets

(56) References Cited

U.S. PATENT DOCUMENTS

| | | | |
|---|---|---|---|
| 8,775,495 B2* | 7/2014 | Lumsdaine | G06F 17/16 708/520 |
| 9,219,499 B2 | 12/2015 | Nasser | |
| 2007/0198621 A1 | 8/2007 | Lumsdaine et al. | |
| 2012/0143932 A1 | 6/2012 | Fossum | |
| 2014/0108481 A1 | 4/2014 | Davis et al. | |
| 2015/0067009 A1 | 3/2015 | Strauss et al. | |
| 2015/0242484 A1 | 8/2015 | Zhao et al. | |
| 2015/0379054 A1 | 12/2015 | Kemert et al. | |
| 2018/0046895 A1 | 2/2018 | Xie et al. | |

OTHER PUBLICATIONS

Kourtis, K. et al., "Optimizing Sparse Matrix-Vector Multiplication Using Index and Value Compression", National Technical University of Athens, School of Electrical and Computer Engineering, Zografou, Greece, 2008, 10 pages.

Silva, M. et al., "Sparse Matrix Storage Revisited", Proceedings of the 2nd conference on Computing Frontiers, Ischia, Italy, May 4-6, 2005, pp. 230-235.

Roca, G., "New Data Structures and Algorithms for the Efficient Management of Large Spatial Datasets", Doctoral Thesis, Department of Computation, University of Coruna, 2014, 337 pages. (accessed Jun. 4, 2019, https://ruc.udc.es/dspace/bitstream/handle/2183/13769/BernardoRoca_Guillermode_TD_2014.pdf?sequence=4).

Saad, Y., Iterative Methods for Sparse Linear Systems textbook—Second Edition, Chapter 3.4—Storage Schemes, pp. 92-95, Published by Society for Industrial and Applied Mathemetics, 2003.

International Search Report and Written Opinion dated Sep. 10, 2019 from International Application No. PCT/IB2019/054784, 9 pages.

* cited by examiner

400

PROCESSING CORE DATA COMPRESSION AND STORAGE SYSTEM

CROSS-REFERENCE TO RELATED APPLICATIONS

This application claims the benefit of U.S. Provisional Patent Application No. 62/683,205, filed Jun. 11, 2018, which is incorporated by reference herein in its entirety for all purposes.

BACKGROUND

The recent surge in the performance of machine intelligence systems is not due to the development of revolutionary new algorithms. Indeed, the core algorithms used in machine intelligence applications today stem from a body of work that is now over half a century old. Instead, it has been improvements in the hardware and software that implement machine intelligence algorithms in an efficient manner that has fueled the recent surge. Algorithms that were once too computationally intensive to implement in a useful manner with even the most sophisticated of computers can now be executed with specialized hardware on an individual user's smart phone. The improvements in hardware and software take various forms. For example, graphical processing units traditionally used to process the vectors used to render polygons for computer graphics have been repurposed in an efficient manner to manipulate the data elements used in machine intelligence processes. As another example, certain classes of hardware have been designed from the ground-up to implement machine intelligence algorithms by using specialized processing elements such as systolic arrays. Further advances have centered around using collections of transistors and memory elements to mimic, directly in hardware, the behavior of neurons in a traditional artificial neural network (ANN). There is no question that the field of machine intelligence has benefited greatly from these improvements. However, despite the intense interest directed to these approaches, machine intelligence systems still represent one of the most computationally and energy intensive computing applications of the modern age, and present a field that is ripe for further advances.

The reason machine intelligence applications are so resource hungry is that the data structures being operated on are generally very large, and the number of discrete primitive computations that must be executed on each of the data structures are likewise immense. A traditional ANN takes in an input vector, conducts calculations using the input vector and a set of weight vectors, and produces an output vector. Each weight vector in the set of weight vectors is often referred to as a layer of the network, and the output of each layer serves as the input to the next layer. In a traditional network, the layers are fully connected, which requires every element of the input vector to be involved in a calculation with every element of the weight vector.

The enormous size of the data structures is problematic from the perspective of storage and memory management. Tautologically, large data structures require a large amount of space to store. However, traditional ANNs present a somewhat unique data management problem in that the data structures can be sparse, but the sparsity is difficult to utilize for purposes of data storage resource mitigation because the sparse data can encode important "spatial information" regarding the relative locations of non-sparse data elements within the data structure. Furthermore, since traditional ANNs are difficult to parallelize, intermediate outputs in the execution of an ANN need to be stored, at least temporarily, between computations.

Methods for efficiently conducting matrix computations with sparse matrices and for compressing sparse matrices are known in art and can be applied to combat the above-mentioned issues. Known methods include specific formats for sparse matrixes to be stored so that the non-sparse values of the matrix can be readily retrieved and applied to a calculation using the matrix. One such format is known as compressed sparse row (CSR) format in which data representing a matrix is more efficiently stored in three separate matrices. One of those matrices stores the non-sparse values, one stores the column indices of the non-sparse values in the original matrix, and one stores a pointer for the row indices of the original matrix with reference to the other two newly-generated matrices.

FIG. 1 illustrates a directed graph 100 for the computation of a modern machine intelligence system. The input to directed graph 100 is an input tensor X. The output of directed graph 100 is an output tensor Y. The input could be an encoding for a picture, such as an image of a cat 101. In this example, execution of directed graph 100 involves the graph providing an encoding of a textual guess as to what the content of the encoded image contained. The graph output can be referred to as an inference generated by the directed graph because the machine intelligence system is effectively inferring what the picture shows from the encoding of the picture. As such, if directed graph 100 represented a properly trained machine intelligence system, execution of graph 100 with input tensor X would produce an output tensor Y which encoded the word "CAT" as illustrated.

The edges of directed graph 100 represent calculations that must be conducted to execute the graph. In this example, the graph is broken into two sections—a convolutional section 102 and a fully connected section 103. The convolutional portion can be referred to as a convolutional neural network (CNN). The vertices in the directed graph of CNN 102 form a set of layers which includes layers 106, 107, and 108. The layers each include sets of tensors such as tensors 109, 110, and 111. The vertices in the directed graph of fully connected section 103 also form a set of layers which includes layers 112 and 113. Each edge in directed graph 100 represents a calculation involving the origin vertex of the edge. In CNN 102, the calculations are convolutions between the origin vertex and a filter. Each edge in CNN 102 is associated with a different filter $F_{11}$, $F_{n1}$, $F_{12}$, $F_{n2}$ etc. As illustrated, filter $F_{12}$ and tensor 109 are subjected to a full convolution to generate one element of tensor 111. Filter $F_{12}$ is "slid around" tensor 109 until a convolution operation has been conducted between the filter and the origin vertex. In other approaches, filter $F_{12}$ and a portion of tensor 109 are multiplied to generate one element of tensor 111 and the full convolution is used to generate multiple elements of tensor 111. In fully connected section 103, the calculations are multiplications between a set of weights and the values from the prior layer. In fully connected section 103, each edge is associated with a unique weight value that will be used in the calculation. For example, edge 114 represents a multiplication between weight $w_n$ and input value 115. The value of element 116 is the sum of a set of identical operations involving all the elements of layer 112 and a set of weight values that uniquely correspond to the origin vertex of each edge that leads to element 116.

Execution of directed graph 100 involves many calculations. In the illustration, dots are used in the vertical directions to indicate the large degree of repetition involved in the directed graph. Furthermore, directed graph 100 represents a relatively simply ANN, as modern ANNs can include far more layers with far more complex interrelationships between the layers. Although not illustrated by directed graph 100, the outputs of one layer can loop back to be the inputs of a prior layer to form what is often referred to as a recursive neural network (RNN). The high degree of flexibility afforded to a machine intelligence system by having numerous elements, along with an increase in the number of layers and complexity of their interrelationships, makes it unlikely that machine intelligence systems will decrease in complexity in the future. Therefore, the computational complexity of machine intelligence systems is likely to increase in the future rather than diminish.

All of the data involved in the training and execution of directed graph 100 needs to be stored and retrieved as the calculations mentioned in the paragraph above are executed. The weights in fully directed section 103, the filters in CNN section 102, and the intermediate results of the execution of the graph from input tensor X all the way to the output tensor Y, all need to be stored to and retrieved from memory as the algorithmic logic units and other computational hardware executes or trains the directed graph. Given that the execution of even a basic ANN can involve hundreds of billions of computations with outputs that need to be stored for the next round of computation, methods that address the space required to store all this data, and the speed at which the data can be compressed for storage and decompressed to facilitate further computation, will greatly improve the field of machine intelligence.

SUMMARY

Methods and systems regarding the rapid and efficient compression and decompression of sparse data are disclosed. In a specific embodiment of the invention a method is provided. The method includes compressing a set of data from a sparse matrix, evaluating a sequence of data entries from the set of data, extracting a sequence of sparse data values from the sequence, extracting a sequence of non-sparse data value run lengths from the sequence, formulating a set of row pointers from the sequence, storing the sequence of sparse data values in a first set of memory addresses, and storing the sequence of non-sparse data value run lengths in a second set of memory addresses. The set of row pointers identify a set of rows of the sparse matrix in both the first and second sets of memory addresses. Rapid decompression of the compressed set of data can be conducted using the row pointers.

In another specific embodiment of the invention, a system for compressing a set of data from a sparse matrix is provided. The system includes a memory and a clocked logic that evaluates a sequence of data entries from the set of data. The clocked logic is configured to execute the following steps in response to the evaluation of the sequence of data entries from the set of data: extracting a sequence of sparse data values from the sequence of data entries; extracting a sequence of non-sparse data value run lengths from the sequence of data entries; formulating a set of row pointers from the sequence of data entries; storing the sequence of sparse data values at a first set of memory addresses in the memory; and storing the sequence of non-sparse data value run lengths at a second set of memory addresses in the memory. The set of row pointers identify a set of rows of the sparse matrix in both the first set of memory addresses and the second set of memory addresses.

DETAILED DESCRIPTION

Figure 1:
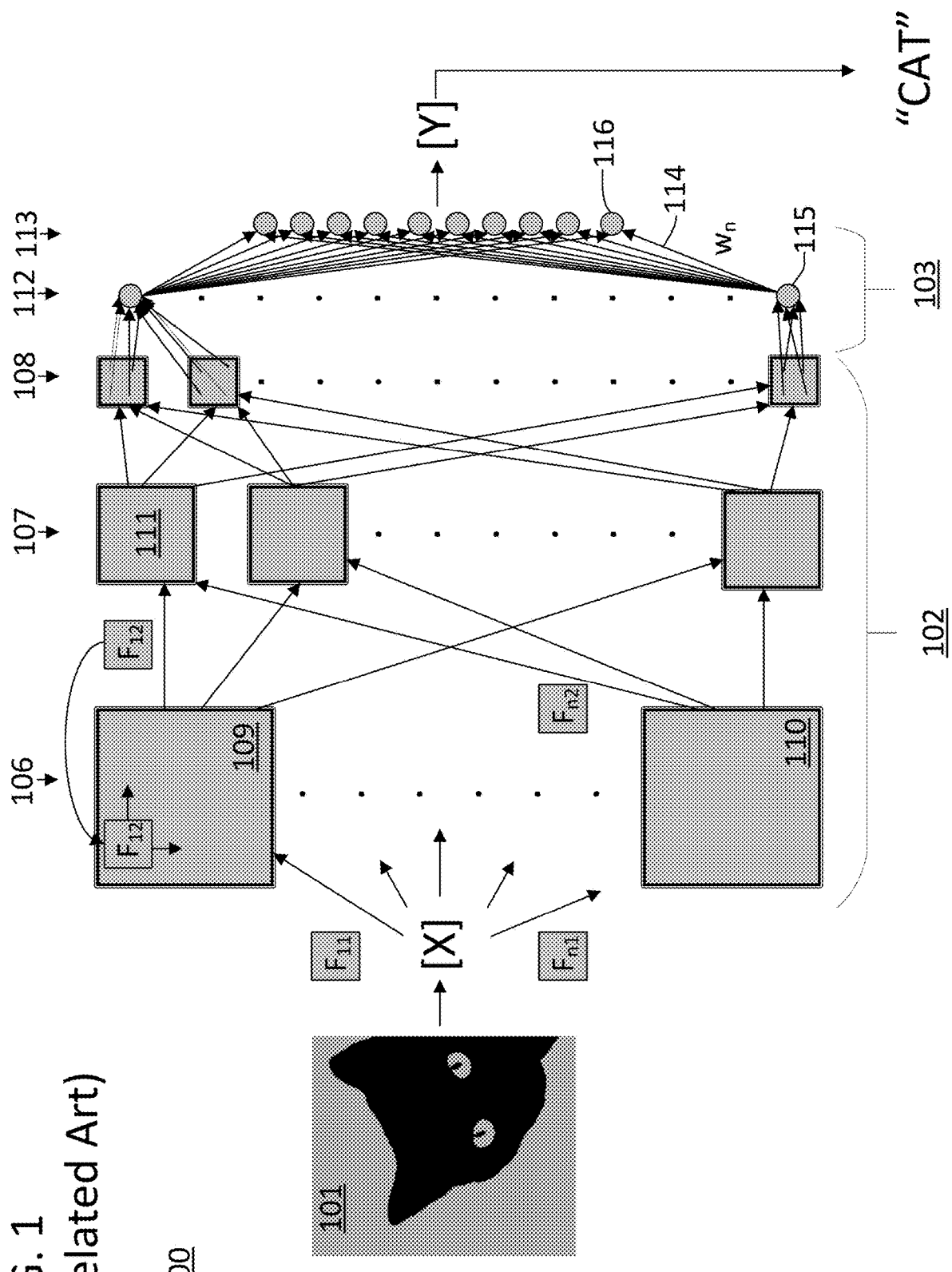
FIG. 1 provides a directed graph of an artificial neural network in accordance with the related art.

Approaches disclosed herein allow for the efficient compression, decompression, and movement of data in a processing core that is optimized for the execution of large directed graphs such as those involved with artificial neural networks (ANNs) and other machine intelligence systems. The approaches disclosed herein include a processing core and associated computer-implemented methods. All the data used to instantiate, execute, and modify a directed graph can be referred to herein as "directed graph data." In the specific case of ANNs, the data can include specific activations, weights, biases, or any intermediate results necessary for the drawing of an inference from or applying training to the network. The approaches disclosed herein include methods for rapidly compressing and decompressing the directed graph data. The approaches disclosed herein include data structures that are optimized for facilitating such rapid compression and decompression, as well as the rapid random access of directed graph data from a memory for use in executing computations by the computational units of a processing core. Examples of such computational units include arithmetic logic units (ALUs) and other logic blocks. Directed graph data can be placed in these data structures to allow the data to propagate efficiently between memory hierarchies and between memory and computation sub-blocks in the processing core.

The compression and decompression methods disclosed herein can involve the use of a specialized data structure. The data structure can be multi-dimensional. In specific embodiments, the data structure will be a two-dimensional tile defined by rows and columns. The data structure can further be optimized to facilitate the rapid random access of directed graph data from a memory for use in executing computations by a processing core. All the directed graph data necessary to execute the directed graph can be stored in a set of instantiations of these data structures. The size of the data structures can be manipulated at the microcode or assembly code level of a processing core optimized for the execution of large directed graphs. The size of each instantiation of the data structure can vary, and the same directed graph can be stored in instantiations of the data structure with varying size. The size of the data structure may be software configurable, set and determined by the hardware of a processing core, or a combination of both. For example, one dimension of the data structure, such as the size of a repeating unit of the data structure, could be set by the physical limitations of a memory on the processing core, where the size of the repeating unit was equivalent to the physical size of a column or row of an array of the memory. As another example, the size of a repeating unit of the data structure could be set by the physical size of a bus in the processing core (e.g., if the processing core operated with a bus size of 16 bytes, then a repeating unit of the data structure could be set to 16 bytes). Alternatively, a physical limitation of a memory or bus on the processing core could set the smallest individually addressable element or datum in the data structure (e.g., if the processing core had ALUs that conducted operations on 8-byte operands, then the smallest individually addressable element in the data structure could be an 8-byte element).

The data structure can comprise multiple portions. The data structure can include a header and a payload. The header and the payload can be made up of identical structural units. For example, if the data structure were a tile defined by rows and columns, the header and payload could each consist of multiple rows having the same number of columns. The data structure can be wholly comprised of a repeating unit sized datum or data element. The unit sized datum could be the smallest individually addressable element of the data structure. The unit sized datum could be defined by a data type and size such as 6-bit integer, 8-bit floating point, etc. In specific approaches, a given processing core may include data structures with variant unit sized datums. For example, a given processing core could simultaneously include data structures with unit sized datums of 8, 16, or 32-bit floating point numbers. The payload of the data structure could store directed graph data. Related portions of directed graph data can be assigned to the payloads of one or more instantiations of the data structure. For example, a filter in a CNN can be stored in one instantiation of the data structure, or it can be stored in multiple instantiations of the data structure.

The header can include metadata regarding the data held in the payload and the data structure itself. The header could contain a descriptor segment and a digest segment. The descriptor could include the data type and resolution of the data stored in the data structure. The descriptor could include the compression state of the tile—indicating whether the tile was compressed or not. The descriptor could include the dimensions of the data structure. The descriptor could include the dimensions of the directed graph data tensors stored by the data structure. The descriptor could include a size of the data structure. The digest segment could include an abstract of the data in the payload such as a histogram of the data values, power information for the data values, a spectrum approximation, or other statistical information of the data values. The digest information can be computed by a processing core executing or training the directed graph and could embed the information in the descriptor. A computational unit operating on the data structure could use the digest information to make a computation using the data structure more efficient. For example, the computation unit could skip computation or convert the data format to a lower precision format prior to executing a computation using the data structure if the digest information indicated that the data structure stored all zeros or had a power level below a certain threshold.

The header of the data structure could identify the content of the data structure using the language of the directed graph. For example, the header could include information indicating it stored a filter of a directed graph using an identifier known at the graph-level of the system, while the payload included the filter values themselves. The header could also identify that the data structure only held a portion of the content and could identify additional data structures that held the remainder of the content. The header could also contain a unique identifier for the data structure. The unique identifier could be unique among all data structures on a given processing core. As described in more detail below, the data structure header and payload could also include values used to assist in the efficient decompression and compression of the directed graph data stored in the payload.

Figure 2:
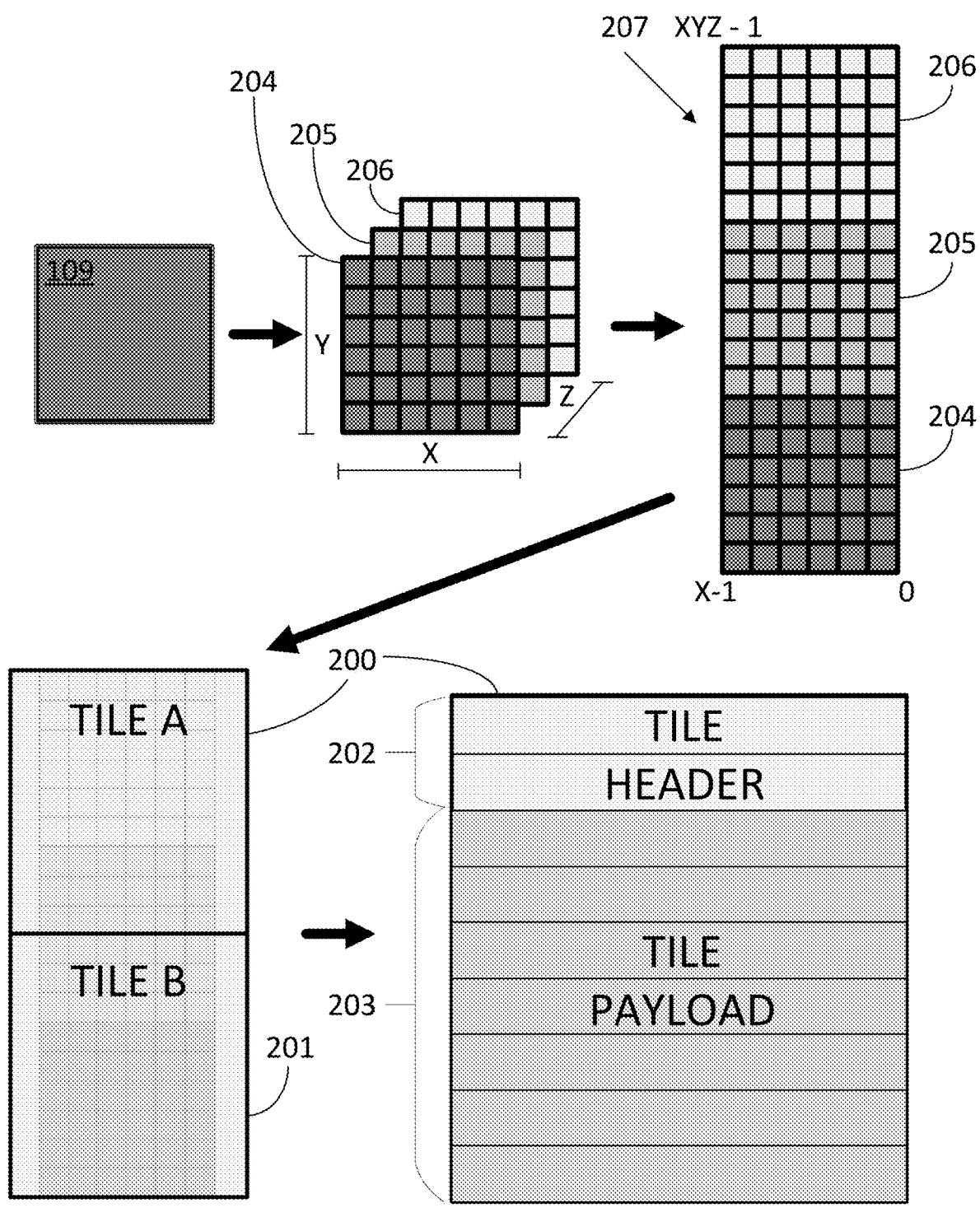
FIG. 2 provides an illustration of translating a three-dimensional tensor into the address space of a two-dimensional physical or virtual memory and storing the tensor in a data structure within that memory space that can be used to efficiently compress and decompress the tensor data in accordance with some of the approaches disclosed herein.

FIG. 2 provides an illustration of a data structure in accordance with specific embodiments disclosed herein that can be used to efficiently compress and decompress data that is utilized in the execution of a directed graph. In this approach, the data structure is a data tile in which elements of the tile can be thought of as entries in a two-dimensional matrix. In FIG. 2, the data structure is represented by two independent instantiations thereof in the form of data tile A 200 and data tile B 201. The detailed view of data tile A 200 shows that the tile is formed by a repeating structure of rows with an identical number of columns in each row. The detailed view also shows tile header 202 consisting of two of such rows and tile payload 203 consisting of 7 rows. The payload of data tile A 200 can store decompressed directed graph data, but it can also store directed graph data in a specific format that is amenable to rapid decompression and compression of tensors of directed graph data used in computations for the execution of the directed graph.

The illustration in FIG. 2 shows the relationship between the graph-level, memory-address-level, and tile-level of a processing core in accordance with specific embodiments disclosed herein. The memory-address-level can be the lowest level known to the computational apparatus of the processing core and can include an addressing system which allows the computational apparatus to request specific portions of the tensors that make up the directed graph. Lower levels of the system can be managed by the data management block of the processing core.

FIG. 2 includes tensor 109 from FIG. 1. Tensor 109 is an input tensor to a layer in a CNN which will be used in a convolution operation during the execution of the directed graph to which it is a part. In the illustrated case, tensor 109 is a three-dimensional tensor which can be represented by "z" two-dimensional matrices 204-06. In this illustrated simplified case, the dimension of tensor 109 in the "Z" direction is three which is why 3 two-dimensional matrices are needed. However, this approach is not limited to three-dimensional tensors and can operate with tensors whose higher-level dimensions have domains that are orders of magnitude larger than three. The size of the tensor in the X and Y domains are 6 and 6 respectively as represented by each of matrices 204-206. In a practical application, these numbers could each range into the millions or billions.

The squares in matrices 204-206 represent individual directed graph data values. The values could be represented in memory using data types and precision levels equal to that of the individual data elements of data tile 200. However, this is not a limiting element of the disclosed system. The data elements of data tile 200 could have much higher precision levels and be alternative data types. The individual directed graph data values can be addressed using a standard cartesian coordinate system. For a three-dimensional tensor, the coordinates would be (x, y, z) with x ranging from 0 to X−1, y ranging from 0 to Y−1, and z ranging from 0 to Z−1.

The translation from graph-level to data-tile level can include a translation into a memory-address-level data space. The memory-address-level data space will likely be a one, two, or three-dimensional space based on the hardware of the memory the data structures will be stored in. A typical planar memory system such as a traditional flash memory will be two-dimensional. A stack-based memory is one-dimensional. A modern three-dimensional memory cube is three-dimensional. However, tensors in a directed graph can have dimensionality of 4-dimensions, 5-dimensions, and more. As such, a first translation can reduce the dimensionality of the directed graph data from the tensor space to the memory-address-level space. Alternatively, the memory-address-level space can be a virtualized address scheme disassociated from the hardware of the processing core, while still utilizing a translation of the tensor into a lower dimensionality space to facilitate the compression of the directed graph data. The memory-address-level space does not have to be at the level of physical memory addresses. In some cases, the lowest level of physical memory addresses is masked by a virtualized address scheme for defective memory locations that are no longer available for usage. In light of this fact, the concept of contiguous locations in memory as used herein does not require physically contiguous memory elements in hardware and should be read to include contiguously addressed logical locations in a memory.

FIG. 2 provides an illustration of translating a three-dimensional tensor (e.g., at the graph-level space) into the address space of a two-dimensional physical or virtual memory (e.g., at the memory-address-level space) and storing the tensor in a customized data structure within that memory space. The process involves essentially laying the three matrices that consist of the z-planes of tensor 109 end-to-head as shown in view 207 and addressing them row-by-row from bottom to top. Obtaining an address of a data element in the memory-address-space given an address of the data element in the graph-space would thereby involve the translation: Address (x, y, z)=x+X*y+X*Y*z. Where "X", "Y", and "Z" are the size of the domains of the three-dimensions of the tensor, and (x, y, z) are the coordinates of the data element in the graph-space. The same approach can be applied to tensors of higher dimensionality with the equation being extended by another factor in accordance with this pattern. For example, in the case of a four-dimensional tensor, the equation becomes Address (x,y, z,w)=x+X*y+X*Y*z+X*Y*Z*w. Using this equation, a translation can be found between the graph-level and memory-address-level of the system. This translation can be used to obtain specific data from tensor 109 when executing the directed graph to which tensor 109 is a part. The translation can be the first step in conducting a random access of data in tensor 109.

FIG. 2 also provides an illustration of how tile A 200 and tile B 201 relate to the memory-address-space. As illustrated, the two tiles are used to store the directed graph data associated with the single tensor 109. As explained previously, a single tensor could alternatively be stored in a single data structure (i.e., all of tensor 109 could alternatively have been stored in tile A 200 if the size of tile 200 had been set to a larger value). The directed graph data can be stored in the data structures in compressed or uncompressed form. Furthermore, in a single execution of a directed graph, the same directed graph data can be stored in compressed and uncompressed form in the data structures at different times through the course of that single execution. If the computational elements of a processing core request specific data in graph-space, information necessary to access that data can be stored in the header 202 of data tile 200. The request can be in the form of a graph-space address (e.g., an (x, y, z) address). In certain approaches, the (x, y, z) graph-space address will be provided to a data management block that can compress and decompress tensor data into data structures on the fly. In the illustrated case, this could involve a data management block receiving the graph-space address (0, 0, 0), decompressing tile B 201, obtaining the data at address (0, 0, 0), and providing the data to the computational units of the processing core. The data management block could then compress any result of those computations back into memory once the computational units had conducted the necessary operations.

Figure 3:
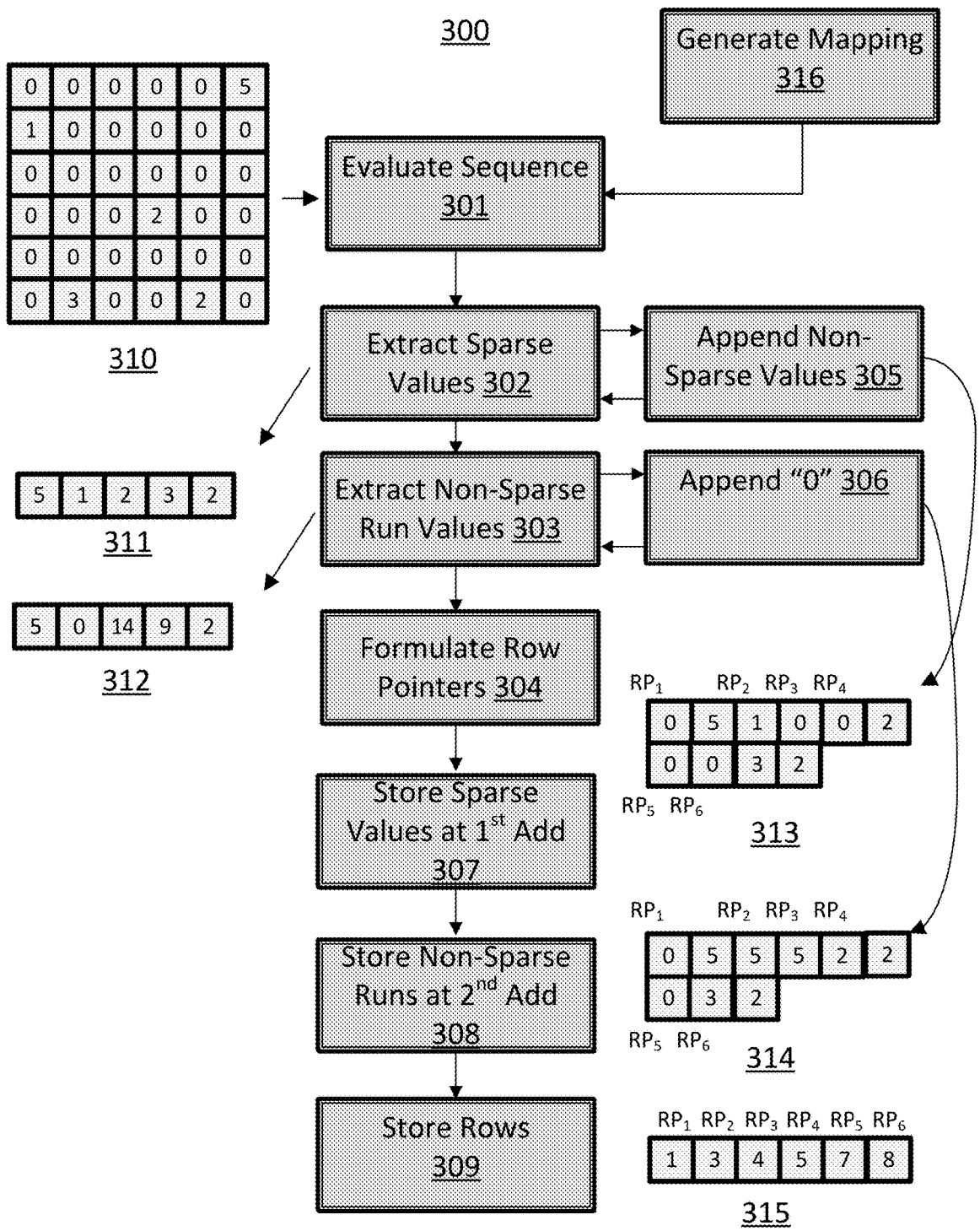
FIG. 3 provides a flow chart for a set of methods for compressing a set of data from a sparse matrix that can be conducted by a data management block in a processing core in accordance with some of the approaches disclosed herein.

FIG. 3 provides a flow chart 300 for a set of methods for compressing a set of data from a sparse matrix that can be conducted by a data management block in accordance with some of the approaches disclosed herein. The method includes a step 301 of evaluating a sequence of data entries from the set of data. As illustrated, the set of data entries 310 is a two-dimensional matrix with a substantial number of "0" values. As such, the value "0" in this matrix is a non-sparse value, and the nonzero values are sparse values. The set of data entries 310 can be pre-stored and obtained from a data tile, or they can be delivered to a data management block for compression from the output of a computational unit such as an ALU. The data entries from the set of data can be considered in an ordered sequence using any ordered movement through the set of data. In the illustrated case, the set of data can be considered row-by-row from top to bottom in a left-to-right fashion. In this and similar approaches, the sequence of data would essentially be a sequence of values from a sparse matrix (e.g., the set of data entries 310) with a start of each new row placed in sequence with an end of a prior row to that new row. This order of movement through the set of data to create a sequence therefrom is only an example, and any form of movement can be used in its place.

Flow chart 300 also includes a step 302 of extracting a sequence of sparse values from the sequence of data entries and a step 303 of extracting a sequence of non-sparse data value run lengths from the sequence of data entries. The non-sparse data value run lengths are the number of non-sparse values appearing between sparse data values in the original sequence of data entries. In the illustrated case, the non-sparse data value run lengths are the number of zero values appearing between each non-zero value in the set of data entries 310. The values can be extracted and stored in sequence in the order in which they appear in the original sequence of data entries. As illustrated, the sparse values 5, 1, 2, 3, and 2 appear in sequence 311 in the order they would appear moving through set of data entries 310 using the order of movement described in the paragraph above. Furthermore, the non-sparse data value run lengths appear in sequence 312. While these two steps are shown in sequence in FIG. 3, in specific embodiments, they are conducted in parallel with the execution of step 301 as the sequence is evaluated.

Flow chart 300 also includes a step 304 of formulating a set of row pointers from the sequence of data entries. Step 304 can be executed while steps 302 and 303 are being executed. In particular, the row pointers can indicate which entries in sequences 311 and 312 correspond with which rows in the original data set of data entries 310. The row pointers can take on numerous forms depending upon how steps 302 and 303 are conducted, and the nature of the set of data entries 310. The row pointers could then be used to decompress the data on a row-by-row basis to effectively allow random access into the compressed data using row addresses of the original data set 310. In approaches in which the original data set 310 holds directed graph data, such an addressing scheme would be beneficial for selecting chunks of a directed graph tensor for computation in a rapid fashion. The chunks of the tensor could then be decompressed on the fly using a data management block, and could be utilized in a computation, with the results being compressed and stored back into memory. The row pointers could separately provide indexes into sequence 311 and sequence 312 to allow for the reconstruction of individual rows in original data set 310. Alternatively, steps 302 and 303 could be conducted to assure that the sequence of sparse data values and the sequence of non-sparse data value run lengths share an equivalent number of elements.

Flow chart 300 also includes alternative steps 305 and 306 that can be conducted to make the generation of row pointers in step 304 efficient and improve the overall efficiency of the compression and decompression scheme. In step 305, a non-sparse data value is appended to a current sequence of sparse data values when the non-sparse data value is a first entry in a row of a sparse matrix that is being compressed. This step can be conducted while extracting the sparse values from the matrix. In the illustrated case, this will involve appending a zero value to sequence 311 when the zero value is the first value in a row of data set 310. In step 306, a zero value is appended to a current sequence of non-sparse data value run lengths in response to the appending of the non-sparse data value to the current sequence of sparse data values. Both these steps are somewhat nonintuitive in that a run length of zero is being stored, which would not generally provide any spatial information concerning the original data structure, and a non-sparse value is being stored as if it were a sparse value. As illustrated, the compressed data sets 313 and 314 are both larger than data sets 311 and 312. Which is also counterintuitive if the goal is compression. However, using this approach, the row pointers generated in step 304 can take on a basic structure and still unambiguously represent original data set 310.

Comparing sequences 313 and 314 to sequence 311 and 312, the approach that utilizes steps 305 and 306 appears to be a less efficient compression system because the number of data elements required to represent the original data set 310 has increased. However, the set of row pointers formulated in step 304 can now be a simple sequence of values 315 that provide an index into both sequence 313 and 314 and unambiguously represent the original data structure. Using row pointer $RP_2$ as an example, the second row pointer from sequence 315 provides an index of "3" and when that index is applied to sequences 313 and 314 values of "1" and "5" are retrieved. These values in turn indicate that the second row of data set 310 is the number "1" followed by five "0" entries. In contrast, if the same approach was attempted with sequences 311 and 312, a more complex row pointer system would be required because it would be unclear if the first row began with five "0" values or a value of "5" followed by five "0" values.

The approach utilizing steps 305 and 306 is also an improvement over prior compression methods such as CSR because it is independent of the number of columns in the original data structure 310. A presupposition of CSR is that the number of columns in the original data set is known prior the compression. However, approaches in accordance with steps 305 and 306 will function to unambiguously compress any data sequence regardless of the number of columns in the input data set. Such an approach is beneficially applied to processing cores where a data management block has the flexibility to compress data into data structures of varying size. For example, data tiles having a varying number of columns.

Flow chart 300 also includes a step 307 of storing the sequence of sparse data values extracted in step 302 at a first contiguous set of memory addresses. The memory addresses can be at the memory-address space described above. Flow chart 300 also includes a step 308 of storing the sequence of non-sparse data value run lengths at a second contiguous set of memory addresses. Flow chart 300 also includes a step of storing the set of row pointers as formulated in step 304 in memory. The row pointers can be stored at a third contiguous set of memory locations. This can be conducted in a step 309 of flow chart 300. The memory addresses can be at any level of abstraction and can be physical or virtualized addresses. In particular, the addresses can be at the memory-address-level described above with reference to FIG. 2. Furthermore, the row pointers can be stored in the header portion of a tile in the tile-space and the other two data sequences can be stored in the tile payload section of the same tile in the tile-space. In approaches that utilize steps 305 and 306, the row pointers can provide offsets into the first contiguous set of memory addresses and the second contiguous set of memory addresses. The row pointers could therefore be simple integer values that could be appended to a base address for the other data structures in order to retrieve the indexes values.

The approach illustrated in FIG. 3 shows each entry of data set 310 as a simple integer. However, the values can be more complex and the memory locations can likewise store complex values such as 8-bit, 16-bit- and 32-bit floating point numbers. In the situation of a sparse value run length exceeding the size of a single data element (e.g., a memory location storing an 8-bit integer and the run length exceeding 256), more than one value can be appended to the sequence of non-sparse run values and a non-sparse value can be appended to the sequence of sparse values to represent this occurrence.

FIG. 3 also includes a step 316 of generating a mapping. The mapping can be used for random access of data elements using a request generated at the graph-level of the system. In specific approaches, step 316 can involve generating a mapping from an element of a sparse tensor, such as tensor 109 to an element of a sparse matrix, such as that represented by data set 310. The mapping can take the form of a function, lookup table, or combination of those. The mapping can include the address translation function Address (x, y, z) described with reference to FIG. 2 above.

Figure 4:
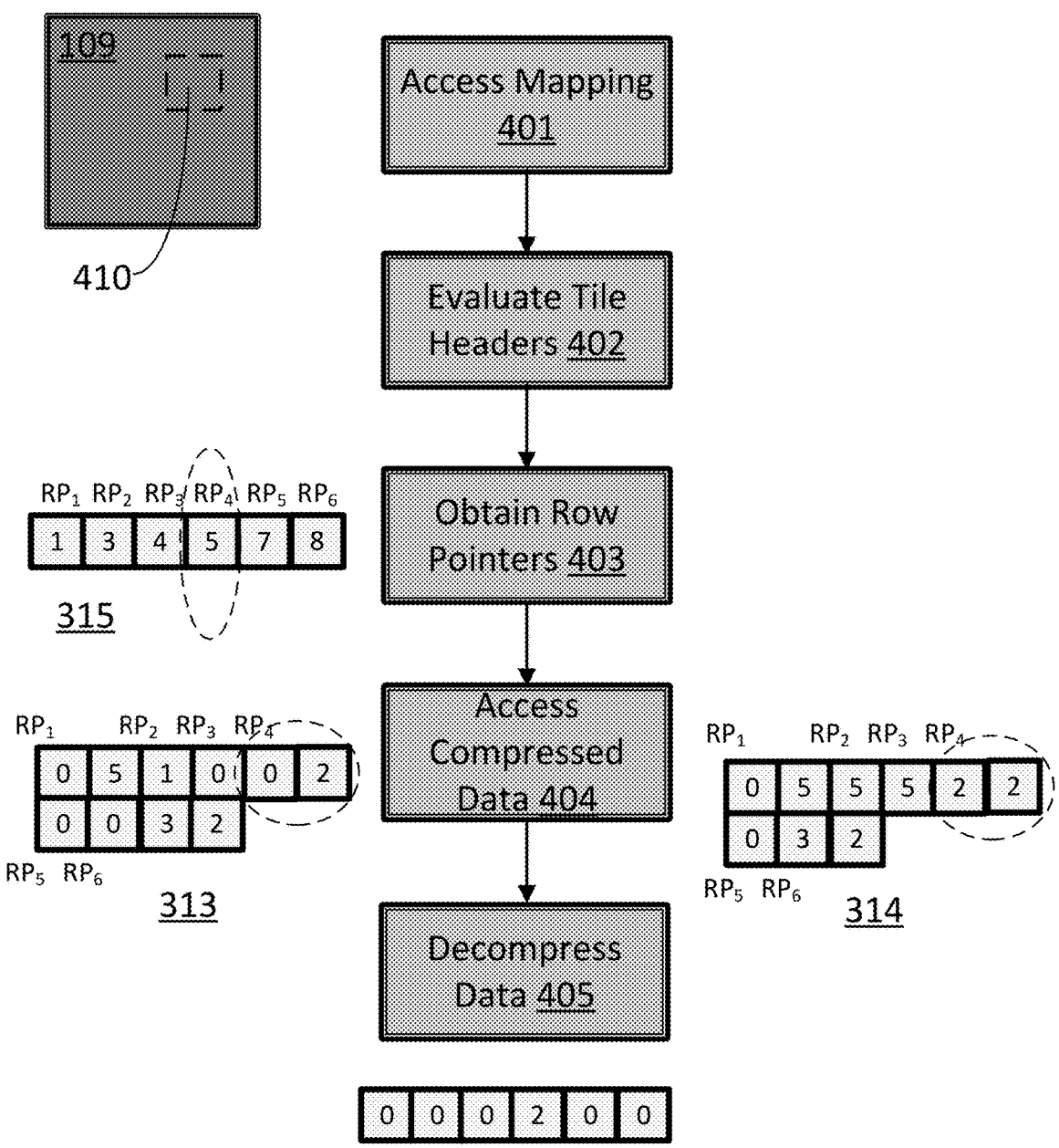
FIG. 4 provides a flow chart for a set of methods for decompressing data that can be conducted by a data management block in accordance with some of the approaches disclosed herein.

FIG. 4 provides a flow chart 400 for a set of methods for decompressing data that can be conducted by a data management block in accordance with some of the approaches disclosed herein. As mentioned previously, a data management block in a processing core that utilizes some of the compression approaches disclosed herein can decompress directed graph data on the fly in order to provide data for a computation using a specific portion of directed graph data. The portion 410 can be, for example, a portion of an input tensor that will be involved in a convolution computation with a filter. In the illustrated approach, the data management block will receive an instruction to retrieve a portion of the data associated with tensor 109. The data management block can fetch the graph data by first conducting a step 401 in which a first mapping, previously generated by the data management block in a step 316, is accessed to find an uncompressed memory-address range for graph data 410. The mapping can involve the header of data structures such as header 202 of tile 200. The range could be in the form of values (x–x+n, y–y+m, z–z+k). The data management block could then evaluate tile headers in a step 402 using any form of memory lookup algorithm to find the tiles storing the identified data.

Flow chart 400 continues with an example of obtaining a single row of compressed data. In step 403, row pointers are obtained from the data tile accessed in step 402. The row pointer numbers are in the uncompressed memory-address space and hence they can be derived from the range obtained from the mapping in step 401. In the illustrated case, such derivation will produce a request for row four. Step 403 would therefore comprise obtaining the value "5" from the set of row pointers by accessing the fourth value in the sequence of stored row pointers. This step could involve applying an offset of three to a base address of the sequence of stored row pointers. In step 404, the row pointer is used to access the other two portions of the compressed data structure to obtain the non-sparse run lengths and the sparse data values associated with the row. In step 405, the accessed data is used to formulate the decompressed data sequence as illustrated. The illustrated case is simplified in that a request for data will more often include a request for a series of rows of data. However, sequential rows can be easily accessed because the compressed data space is stored with the sequence of rows intact. The intermediate row pointers can therefore be discarded and step 404 can simply involve obtaining all data in sequence from one row pointer to a second larger row pointer. In certain approaches, all of steps 403-405 can be conducted in a single clock cycle by a data management block that is specially configured to operate with compressed data in the specified format.

Figure 5:
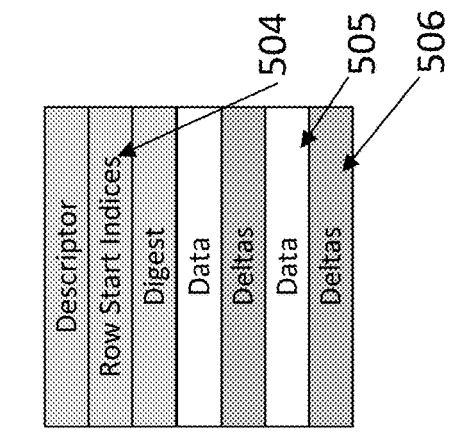
FIG. 5 provides a set of example data structures that are in accordance with some of the approaches disclosed herein.
Figure 5:
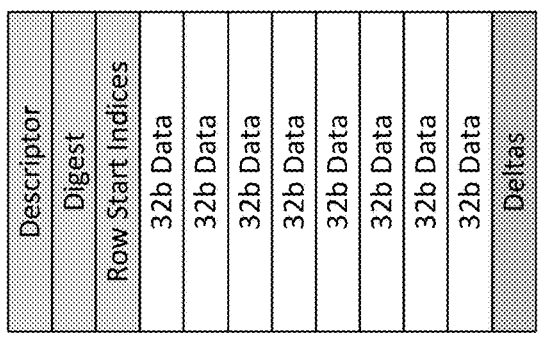
Figure 5:
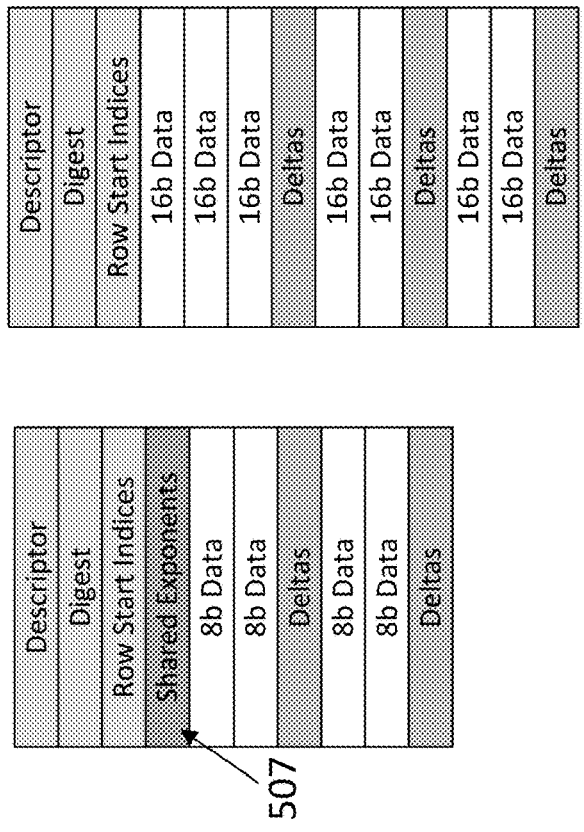

FIG. 5 illustrates a set of example data structures that are in accordance with some of the approaches disclosed herein. More specifically, the data structures are two-dimensional data tiles in accordance with the disclosure of FIG. 2. As illustrated, the data tiles each include a payload and header. However, each example data structure differs in the type of minimally addressable data element it is meant to store, which has an impact on the overall order of the data tile. The common elements of the data tiles in FIG. 5 are the descriptor, digest, row start indices, data rows, and delta rows. The descriptor and digest rows are as described above in FIG. 2. In the illustrated case, the descriptor of each tile in FIG. 5 would indicate that the payload was compressed. The descriptor could also include a unique identifier for the data tile. The row start indices, data rows, and delta rows are in accordance with the row pointer sequences, non-sparse data sequences, and sparse data run length value sequences described with reference to FIG. 3. An exemplary row of row start indices 504, row of data 505, and row of deltas 506 in tile 503 are indicated in the figure. The row of deltas 506 could correspond with a set of contiguous memory locations used in step 308. The row of data 505 could correspond with a set of contiguous memory locations used in step 307. The row of row pointers 507 could correspond with a set of contiguous memory locations used in step 309.

Each tile in FIG. 5 is defined by a row length and has a number of rows. A first portion of the number of rows hold the sequence of sparse data values from the sequence of data entries. These rows are labeled "data." The sequence of sparse data values would wrap from one row to another from top-to-bottom through the data tile. However, other orders of movement through the data structure could be used in accordance with this disclosure. A second portion of the number of rows hold the sequence of non-sparse data value run lengths. These rows are labeled "deltas." The sequence of non-sparse data value run lengths will likewise wrap from one row to another through the data tile. In the illustrated approach, the deltas are evenly distributed with the data rows but in other approaches can be clumped in separate sections.

As mentioned previously, the tiles can store different sized data elements. Tile 500 stores 8-bit data floating point data elements. The tile also utilizes another compression scheme in combination with those described above. The compression scheme relates to the fact that the tile stores floating point data elements with common exponents and involves compressing the shared exponents of multiple data elements in the tile. Data tile 500 includes a specialized row 507 labeled "shared exponents" which stores exponents shared with non-sparse values in tile 500 and an indication of which non-sparse values share those values. Tile 501 stores 16-bit data. Tile 502 stores 32-bit data. Tile 502 stores the highest precision data out of all four tiles. As seen, the size of the data elements sets the ratio of rows of deltas to rows of data where the ratio increases as the size of the data elements increases. The number of deltas required for some of the compression schemes described above is set by the number of data elements. Specifically, in certain compression schemes there will be one delta for each entry of data. Furthermore, in some cases data tiles for a processing core will likely have a fixed width based on the size of buses or computation units in the processing core regardless of the size of the individual data elements in the tile. As a result, if the data management block produces a 16-bit data tile there will be twice as many entries per row as when the block produces a 32-bit data tile. Therefore, and as reflected in FIG. 5, there is a need for twice as many delta rows in the 16-bit data tile as in the 32-bit data tile.

The mapping generated in step 316 can be specifically generated to facilitated execution of a directed graph involving tensor 109. In specific approaches, step 316 can involve generating a mapping from an element of a sparse tensor, such as tensor 109 to an element of a sparse matrix, such as that represented by data set 310. Similarly, in specific approaches, step 316 can involve generating a mapping of a set of elements in a sparse tensor to a set of elements in a sparse matrix. The set of elements can consist of a unit of data values from the sparse tensor that are commonly used in computations together. For example, the set of elements could be a set of input data from a layer of a CNN that are the same size as a filter that is used on that layer of the CNN. In specific approaches, an element, or set of elements, of the sparse tensor is stored in a single compressed data structure such as a single compressed data tile 200. In specific approaches, an element, or set of elements, of the sparse tensor can be extracted from the single compressed data tile using the mapping generated in step 316, and the first 504, second 505, and third 506 row in the single compressed data tile, without accessing any other row of the data tile.

A data management block in accordance with some of the approaches disclosed herein can include clocked logic units to conduct on the fly decompression and compression. For example, a clocked logic unit could conduct all of steps 302-306 in a single clock period. The unit could be pipelined so that the steps were conducted in parallel on different data. As another example, another clocked logic unit could conduct all of steps 403-405 in a single clock period. The unit could be pipelined so that the steps were conducted in parallel on different data. The clocked logic unit could be an element of the data management block mentioned throughout this disclosure. The data management block could also alter the size of data structures on the fly to accommodate a change in resource usage that results from any computation conducted using the data structures.

Figure 6:
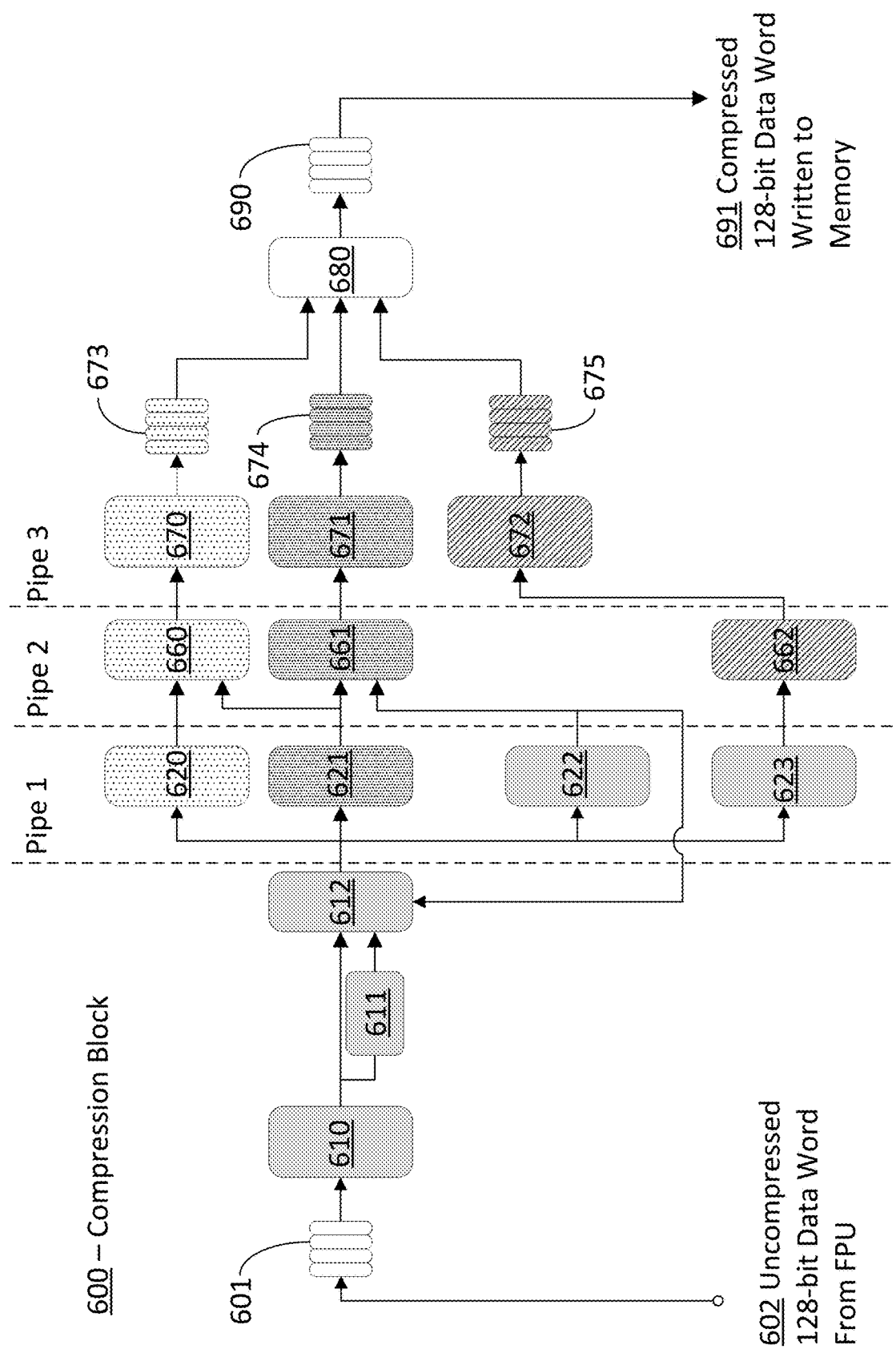
FIG. 6 provides a compression block in accordance with some of the approaches disclosed herein.

FIG. 6 illustrates an example clocked logic unit in the form of a compression block 600 that is in accordance with specific embodiments. The figure is labeled with three pipe indicators to illustrate the different parallel operations conducted by the overall block simultaneously in each clock cycle. The input to compression block 600 is a 128-bit data word 601 received on a 128-bit bus 602 which is coupled to a processing unit or memory. In specific embodiments of the invention, bus 602 is coupled to a processing unit so that data words generated by the processing unit are immediately compressed before they are stored in memory. The size of the data bus and data word used in FIG. 6 are for purposes of illustration only and should not be interpreted to limit the scope of the disclosure as buses and data structures of various sizes can be used in accordance with this disclosure.

The output of compression block 600 is a compressed data word 690 delivered to a 128-bit bus 691 which is coupled to a memory. The content of the input data word 601 could be a set of datums containing directed graph data similar to data set 310. The content of the output data word 690 could be a set of datums containing sparse directed graph data similar to sequence 311, a set of datums containing non-sparse run values similar to sequence 312, and a set of datums containing row pointers similar to sequence 315. The manner in which the three types of data are written into memory can be determined by a read arbiter 680. The read arbiter 680 can be designed to assure that the three types of data are stored in memory in accordance with a desired format. In particular, the read arbiter can store the different kinds of data in memory in accordance with the formats described with reference to FIG. 5 above. In specific embodiments of the invention, read arbiter 680 can execute steps 307-309 in FIG. 3.

The number of input data words received from data bus 602 required to generate a compressed data word for writing to memory on data bus 691 depends on the compression efficiency and how sparse the input data is. Until enough data has been received, the compressed data is stored in buffers on assembly blocks 670, 671, and 672. Assembly block 670 assembles a 128-bit data word comprising compressed sparse directed graph data 673. Assembly block 674 assembles a 128-bit data word comprising non-sparse run lengths 674. Assembly block 672 assembles a 128-bit data word comprising row pointer values 675. Each of these words will be assembled at different rates depending upon the characteristics of the input data and the efficiency of the compression scheme. As such, the reader arbiter 680 also plays a role in assuring that enough data has been generated by the assemblers before the data is stored to memory.

The manner in which the three types of data are generated for the assemblers can vary and is described below using an example in which the maximum delta values are 4-bits. In other words, a single delta value, such as the values stored in sequence 312, can be any value from 0 to 15, and if there are more than 16 sparse values in a row in the input data, more than one delta value needs to be used to represent the non-sparse run value. In specific embodiments of the invention, and as mentioned above, a non-sparse value is simultaneously stored in the sequence of sparse values when this occurs.

Compression block 600 begins with the generation of a legalized set of sparse flags which are delivered to the first stage of the pipeline of compression block 600. The legalized sparse flags are indices for the locations of the sparse values in data word 601. For example, if the data word is the 16 8-bit datums in the following list: 0x1 0x1 0x0 0x0 0x0 0x0 0x3 0x0 0x0 0x5 0x0 0x0 0x0 0x0 0x1 0x3, the 16-bit output could be 'b1100001001000011 where binary 1 indicates a sparse value. The set of sparse flags are "legalized" in that the set is modified slightly to account for finite delta values and the data of the prior data word the compression block was operating on. In the embodiment of compression block 600, the indices are also modified to account for the processes conducted in steps 306 and 305 in which an additional non-sparse value is added if a row of the input data word begins with a non-sparse value.

The process of generating the legalized sparse flags involves sparse search block 610, find first flag block 611, legalize flag block 612, and a feedback signal from pipe 2 as output by trailing non-sparse counter block 622. The first block in this chain is sparse search block 610 which evaluates all the datums in the 128-bit data word 601 and outputs an array of sparse flags to indicate which datums in the word contain sparse values. In embodiments in which the 128-bit data word includes 16 8-bit datums, the array of sparse flags can be a 16-bit array with each bit representing whether an associated datum is sparse or non-sparse (e.g., a "1" value is a sparse flag). This set of flags is then evaluated by find first flag block 611 and legalize flag block 612. The find first flag block 611 finds the first flag and outputs the index of the first flag in the array. If the entire word is non-sparse, find first flag block 611 outputs its maximum value. In this case, the maximum index value is 15. There is no reason to distinguish a data word of all non-sparse values from one in which the final datum is sparse because the legalize flag block 612 will force a sparse flag to ensure that more than one delta is used to represent such a long run length of non-sparse values, and the data value itself is recovered at a later stage in data generator 660.

The legalize flag block 612 is designed to take into account special conditions and assure that the set of flags is compatible with the remainder of the compression block. For example, the legalize flag block can force a sparse flag at the start of a row, force a sparse flag at the end of a row, and force a sparse flag if the non-sparse run count is maxed (i.e., 16 non-sparse values in a row). The inputs to the legalize flag block 612 include a 4-bit index of the first sparse value in the word from find first flag block 611, a 16-bit array of sparse flags from sparse search block 610, and a 4-bit count of the non-sparse run length left over from the prior word from trailing non-sparse counter block 622. The legalize flag block 612 can thus sum the non-sparse run length at the start of the new word and the end of the last word to determine if a maximum delta has been exceeded at the turn of one data word to another. For example, find first flag block 611 could take in a set of sparse flags 'b1000100100100000 and output the index of the first sparse value, in this case the output would be 5. Legalize flag block 612 could then generate a current non-sparse run value to the first sparse value which will be 4 in this example. The legalize flag block 612 would then combine this value of 4 with the non-sparse run value from the last input data word to make sure the combination doesn't exceed the max supported delta value of 15.

Compression block 600 continues with the generation of the values needed to generate the packed array of sparse data using data generator 660, a packed array of delta values using data generator 661, and to count the running total number of sparse values in the data words using running sparse counter 662. The operation of each of these branches of pipeline 1 and 2 will be discussed in turn below.

Packed sparse index array generator 620 and data generator 660 form a packed array of sparse data. The 16-bit array of legalized sparse value flags are provided to packed sparse index array generator 620, and generator 620 produces a packed array of indexes to sparse elements in the data word. This creates a maximum of 16 4-bit datums which are indexes of the sparse values in the input data array. The packed array of indexes are then used by data generator 660 to generate a packed array of the sparse data values from the original input data word. The 16-bit indices of the sparse values are used directly by generator 660 to access the values from the data word and pack them together in sequence. For example, if the input data word is the 16 8-bit datums 0x0 0x0 0x0 0x0 0x0 0x01 0x0 0x0 0x0 0x0 0xff 0x0 0x0 0x0 0x03 0x05 the legalize flag block 612 could translate this to a 16-bit array sparse flags 'b0000010000100011. Packed sparse index array generator 620 would then take this array of flags and output the indexes of the sparse values. In this example, the indexes will be 0, 1, 5, 10. These indexes and the count of sparse values from block 621 can be used by generator 660 to select individual sparse values from the input data word and generate packed data which is then provided to assembler 670. In this example, block 660 will go through the original input data word using indexes 0, 1, 5, 10 to select sparse values and output 0x01110305 together with datum/byte valid signal 0xf to the word assembler 670. Once 16 values are accumulated by assembler 670, they will be written to memory.

Data generator 621 and data generator 661 form a packed array of delta values. Data generator 621 converts the 16-bit array of scattered sparse flags into a 16-bit compact mask of sparse flags. In the example above in which the array of sparse flags was 'b0000010000100011, the output of data generator 621 will be 0xf as we have 4 sparse flags set to 1. This output is used by data generator 660 and data generator 661 to know how many sparse and non-sparse run values we are storing. The 16-bit compact mask of sparse flags from data generator 621 and 4-bit trailing zero counter from 622 are used by the data generator 661 to generate a packed array of delta values. The first delta value depends on the value of the trailing zero counter and the remaining values depend on a common analysis of the compact mask generated by generator 621. Data generator 661 is programmed with information regarding the legalization of delta flags in order to generate the appropriate delta values. Each datum generated by data generator 661 is a 4-bit datum indicating the distance between two sparse values.

Valid sparse datum counter 623 takes in the indices of the sparse values and output a 4-bit datum equal to the number of sparse values in data word 601. Running sparse counter 662 effectively accumulates the output of counter 623 for multiple words. The 4-bit number of sparse datums in the word is used by generator 662 to generate the row pointers. The row pointers can be distinctly generated from a count of the sparse datums because data words are provided to compression block 600 with reference to the original rows of the uncompressed data. For example, the size of the input data words can be selected such that a given number (e.g., 16) of data words make up a single row of a data tile that will be compressed using compression block 600. Accordingly, the row pointer generated for each row can be a running tally of the sparse values in 16 data words. This value can be provided to assembler 672 and reset after 16 input data words have been provided to the compression block. Where the running tally will represent an offset for accessing the set of sparse values for the row that made up those 16 data words.

Compression block 600 continues with the generation of the packed arrays of row pointers by assembler 672, the generation of the packed array of delta values by assembler 671, and the packed array of sparse data values by assembler 670. The assemblers assure that enough valid data values have been collected before writing to memory to keep the data compressed for storage in memory.

Figure 7:
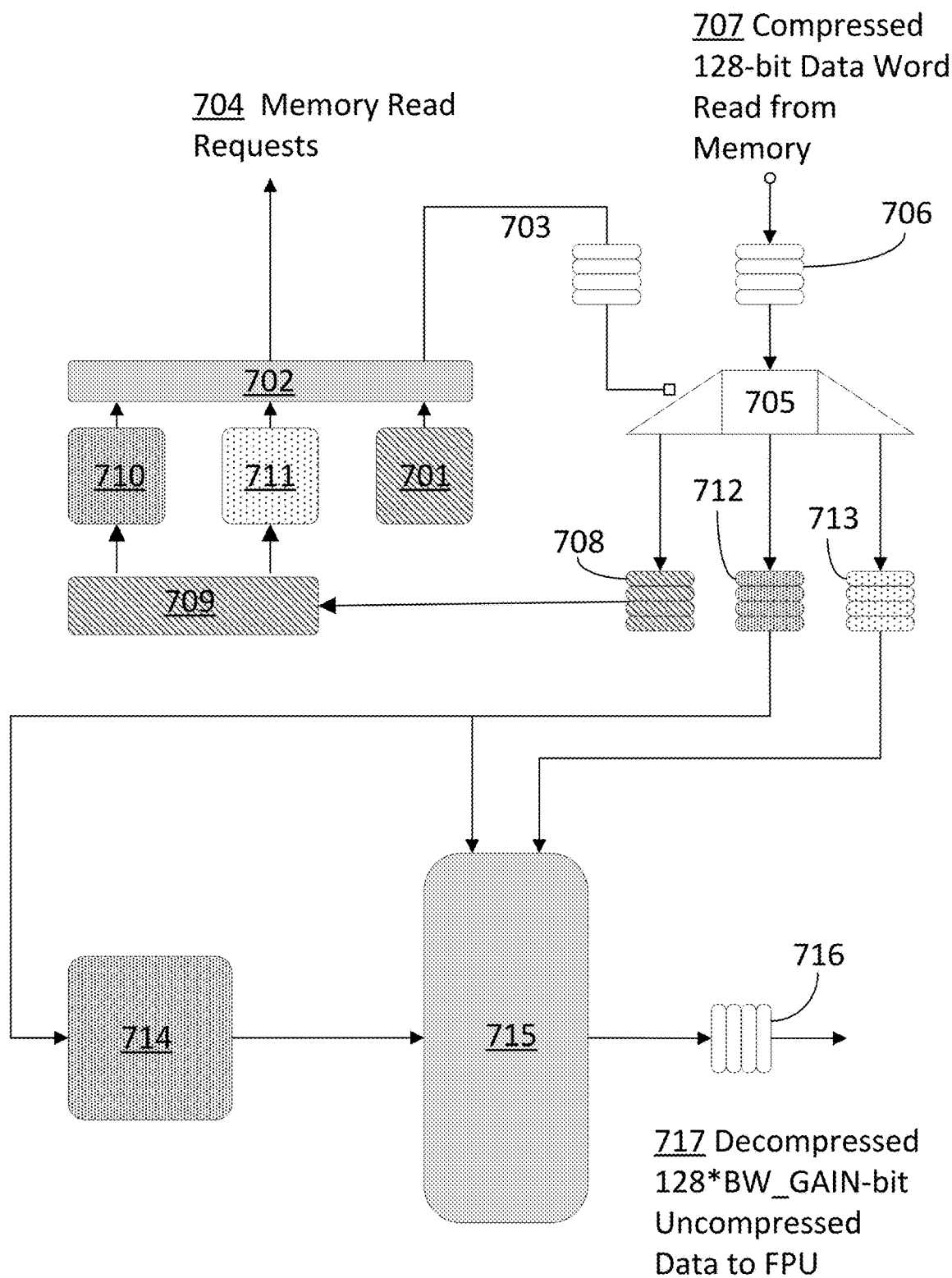
FIG. 7 provides a decompression block in accordance with some of the approaches disclosed herein.

FIG. 7 illustrates an example clocked logic unit in the form of a decompression block 700 that is in accordance with specific embodiments. The input to decompression block 700 is a row request 701 provided to read request arbiter 702. The row request can be generated in combination with a mapping of directed graph data to data tile rows. The data tile rows can be elements of a sparse matrix storing sparse data representing the directed graph data. In response, row request arbiter sends a control word 703 to routing block 705 and a read request to a memory 704 in order to access the value of the requested row pointer. In response, a 128-bit compressed data word 706 will be read from a memory 707. In the first instance, the word will include a set of row pointers 708 and will be routed to address generator 709 which recalls the data associated with the set of row pointers 708 be generating delta address requests 710 and data address requests 711. These values are then sent by row request arbiter as memory read requests 704. In turn, these values are delivered as compressed data words read from memory 707. These data words are routed as delta data words 712 and directed graph data words 713 by routing block 705, in response to additional control words 703 generated by the read request arbiter 702, as illustrated. In the illustrated example, the delta words are routed to compress pointer generator 714 and zero expander 715 using a 16-bit bus. The data words are routed to zero expander 715 using a 128-bit bus.

The generate compress pointer generator 714 governs the bandwidth gain of the decompression. The block reads the deltas data words and figures out how much data can fit onto bus 717. In the illustrated embodiment, the options are 128*BW_GAIN with the allowed gain equal to either 1, 2, or 4. After this calculation is conducted, the block generates a 4-bit delta valid mask and a value for the amount of decompressed data that will be produced. It also produces pointers for the deltas data words and directed graph data words and generates a pointer to the next datum. These values are used by zero expander block 715 to add the zeroes in to the directed graph data values. The zero expander will only inject the number of zero run instructed by the compress pointer generator 714 to assure that the optimum amount of data is produced to form decompressed data word 716. In embodiments in which the datums are floating point numbers with exponents stored such as in 507, compress pointer generator 714 will also generate pointers for the exponents of the datums to be used by the zero expander in generating the exponent entries of the compressed data.

While the specification has been described in detail with respect to specific embodiments of the invention, it will be appreciated that those skilled in the art, upon attaining an understanding of the foregoing, may readily conceive of alterations to, variations of, and equivalents to these embodiments. Any of the method steps discussed above can be conducted by a processor operating with a computer-readable non-transitory medium storing instructions for those method steps. The computer-readable medium may be memory within a personal user device or a network accessible memory. The data structures used to implement the weights, accumulation values, filters, inputs, outputs, etc. of the systems described herein can all be four dimensional or five dimensional tensors. In particular, the data elements stored in the tiles could store at least portions of four and five dimensional tensors. The directed graph and the simplified version of the directed graph described herein could be wholly different structures implemented in memory. Although examples in the disclosure were generally directed to machine intelligence systems, the same approaches could be utilized to any computationally intensive application involving the execution of a directed graph. Although examples in the disclosure were generally directed to ANNs, the same approaches could be utilized to enhance the operation of any machine learning or artificial intelligence hardware and software including support vector machines, systolic arrays, customized programmable logic units such as FPGAs and CPLDs, neuromorphic hardware, and any deep learning approach involving a complex set of layers. Although examples in the disclosure were generally directed to sparse tensors where sparsity was defined by a limited number of non-zero values in a tensor comprising a large number of zero values, sparsity can be defined more broadly with reference to any set of non-repetitive values stored along with a value that is repeated a large number of times. Although examples in the disclosure were directed to the random access of data as requested from the graph-level of a directed graph, the approaches disclosed herein are equally applicable to the random access of data from any higher-level system using the compression scheme herein including the variable or object-level of a human readable software code. These and other modifications and variations to the present invention may be practiced by those skilled in the art, without departing from the scope of the present invention, which is more particularly set forth in the appended claims.

What is claimed is:

1. A method for compressing a set of data from a sparse matrix comprising:
    evaluating a sequence of data entries from the set of data;
    extracting a sequence of sparse data values from the sequence of data entries;
    extracting a sequence of non-sparse data value run lengths from the sequence of data entries;
    formulating, while extracting the sequence of sparse data values and the sequence of non-sparse data value run lengths, a set of row pointers from the sequence of data entries;
    storing the sequence of sparse data values at a first contiguous set of memory addresses;
    storing the sequence of non-sparse data value run lengths at a second contiguous set of memory addresses; and
    wherein the set of row pointers identify a set of rows of the sparse matrix in both the first and second contiguous sets of memory addresses.

2. The method of claim 1, wherein:
    the sparse data values are non-zero values; and
    the non-sparse data value run lengths are zero value run lengths in the sequence of data entries.

3. The method of claim 1, wherein:
    the sequence of sparse data values and the sequence of non-sparse data value run lengths share an equivalent number of elements;
    the row pointers provide offsets into the first set of contiguous memory addresses and the second set of contiguous memory addresses; and
    the sequence of data entries is a sequence of values from the sparse matrix with a start of each new row placed in sequence with an end of a prior row to that new row.

4. The method of claim 1, wherein extracting the sequence of sparse data values further comprises:
    appending, while extracting the sequence of sparse data values, a non-sparse data value to a current sequence of sparse data values when the non-sparse data value is a first entry in a row of the sparse matrix; and
    appending, while extracting the sequence of non-sparse data value run lengths, a zero value to a current sequence of non-sparse data value run lengths in response to the appending of the non-sparse data value to the current sequence of sparse data values.

5. The method of claim 4, further comprising:
    storing the set of row pointers a third contiguous set of memory addresses;
    wherein the sequence of data entries includes at least two rows of the sparse matrix; and
    wherein the non-sparse data value run lengths are zero value run lengths in the sequence of data entries.

6. The method of claim 1, further comprising:
    storing the set of row pointers at a third contiguous set of memory addresses;
    wherein the non-sparse data value run lengths are zero value run lengths in the sequence of data entries; and
    wherein the sparse data values are non-zero values.

7. The method of claim 6, further comprising:
    generating a single compressed data tile;
    the first contiguous set of memory addresses is mapped to a first row in the single compressed data tile;
    the second contiguous set of memory addresses is mapped to a second row in the single compressed data tile; and
    the third contiguous set of memory addresses is mapped to a third row in the single compressed data tile.

8. The method of claim 1, further comprising:
    generating a single compressed data tile;
    the single compressed data tile is defined by a row length and has a number of rows;
    a first portion of the number of rows hold the sequence of sparse data values from the sequence of data entries; and
    a second portion of the number of rows hold the sequence of non-sparse data value run lengths.

9. The method of claim 8, wherein:
    the first contiguous set of memory addresses store one of: 8-bit, 16-bit, and 32-bit floating point numbers.

10. The method of claim 9, wherein the sparse matrix is generated from a sparse tensor, and further comprises:
    generating a mapping from an element of the sparse tensor to an element of the sparse matrix; and
    wherein an element of the sparse tensor can be extracted from the single compressed data tile using the mapping.

11. A system for compressing a set of data from a sparse matrix comprising:
    a memory; and
    a clocked logic that evaluates a sequence of data entries from the set of data;
    wherein the clocked logic is configured to execute the following steps in response to the evaluation of the sequence of data entries from the set of data:
        extracting a sequence of sparse data values from the sequence of data entries;

extracting a sequence of non-sparse data value run lengths from the sequence of data entries;
formulating a set of row pointers from the sequence of data entries;
storing the sequence of sparse data values at a first set of memory addresses in the memory; and
storing the sequence of non-sparse data value run lengths at a second set of memory addresses in the memory; and
wherein the set of row pointers identify a set of rows of the sparse matrix in both the first set of memory addresses and the second set of memory addresses.

12. The system of claim 11, wherein:
the sparse data values are non-zero values; and
the non-sparse data value run lengths are zero value run lengths in the sequence of data entries.

13. The system of claim 11, wherein:
the sequence of sparse data values and the sequence of non-sparse data value run lengths share an equivalent number of elements;
the row pointers provide offsets into the first set of memory addresses and the second set of memory addresses;
the first set of memory addresses are contiguous;
the second set of memory addresses are contiguous; and
the sequence of data entries is a sequence of values from the sparse matrix with a start of each new row placed in sequence with an end of a prior row to that new row.

14. The system of claim 13, wherein:
the sequence of data entries includes at least two rows of the sparse matrix; and
the non-sparse data value run lengths are zero value run lengths in the sequence of data entries.

15. The system of claim 11, further comprising:
a non-sparse data value mask generator that evaluates a sequence of data entries and generates a non-sparse data value flag for a set of datums in the sequence of data entries; and
wherein the non-sparse data value flags is used to formulate the set of row pointers.

16. The system of claim 11, further comprising:
the clocked logic is further configured to store the set of row pointers at a third set of memory addresses;
wherein the non-sparse data value run lengths are zero value run lengths in the sequence of data entries; and
wherein the sparse data values are non-zero values.

17. The system of claim 16, wherein:
the clocked logic is further configured to store the sequence of sparse data values and the sequence of non-sparse data value run lengths in a single compressed data tile;
the first set of memory addresses is mapped to a first row in the single compressed data tile;
the second set of memory addresses is mapped to a second row in the single compressed data tile; and
the third set of memory addresses is mapped to a third row in the single compressed data tile.

18. The system of claim 11, wherein:
the clocked logic is further configured to store the sequence of sparse data values and the sequence of non-sparse data value run lengths in a single compressed data tile;
the single compressed data tile is defined by a row length and has a number of rows;
a first portion of the number of rows hold the sequence of sparse data values from the sequence of data entries; and
a second portion of the number of rows hold the sequence of non-sparse data value run lengths.

19. The system of claim 18, wherein:
the first set of memory addresses store one of: 8-bit, 16-bit, and 32-bit floating point numbers.

20. A method for compressing a set of data from a sparse matrix comprising:
evaluating a sequence of data entries from the set of data;
extracting a sequence of sparse data values from the sequence of data entries;
extracting a sequence of non-sparse data value run lengths from the sequence of data entries;
formulating a set of row pointers from the sequence of data entries;
storing the sequence of sparse data values in a first set of memory addresses;
storing the sequence of non-sparse data value run lengths in a second set of memory addresses; and
wherein the set of row pointers identify a set of rows of the sparse matrix in both the first set of memory addresses and the second set of memory addresses.

* * * * *